(12) United States Patent
Daudelin et al.

(10) Patent No.: US 7,282,961 B1
(45) Date of Patent: Oct. 16, 2007

(54) APPARATUS FOR HYSTERESIS BASED PROCESS COMPENSATION FOR CMOS RECEIVER CIRCUITS

(75) Inventors: Darin Daudelin, Williston, VT (US); Michael J. Lencioni, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/279,658

(22) Filed: Apr. 13, 2006

(51) Int. Cl.
H03K 19/094 (2006.01)
H03K 19/20 (2006.01)

(52) U.S. Cl. ............... 326/121; 326/83; 326/86; 326/87; 326/112; 327/112

(58) Field of Classification Search ............ 326/83, 326/86, 121, 87, 112
See application file for complete search history.

(56) References Cited

U.S. PATENT DOCUMENTS

| 4,256,974 | A | 3/1981 | Padgett et al. |
| 5,057,711 | A | 10/1991 | Lee et al. |
| 5,111,081 | A | 5/1992 | Atallah |
| 5,315,173 | A | 5/1994 | Lee et al. |
| 5,319,258 | A | 6/1994 | Ruetz |
| 5,506,528 | A | 4/1996 | Cao et al. |
| 5,585,744 | A * | 12/1996 | Runas et al. .......... 326/86 |
| 6,184,704 | B1 | 2/2001 | Wang et al. |
| 6,275,094 | B1 | 8/2001 | Cranford, Jr. et al. |
| 6,429,710 | B1 | 8/2002 | Ting et al. |
| 6,545,521 | B2 | 4/2003 | Dale et al. |
| 6,717,445 | B1 * | 4/2004 | Nair .................. 327/112 |
| 6,750,677 | B2 | 6/2004 | Sumita |
| 6,879,198 | B2 | 4/2005 | Kumar et al. |
| 6,992,518 | B2 | 1/2006 | Lundberg |
| 2001/0010476 | A1 | 8/2001 | Weng et al. |
| 2007/0063738 | A1* | 3/2007 | Fischer ............... 326/83 |

FOREIGN PATENT DOCUMENTS

JP 62123827 5/1987

* cited by examiner

Primary Examiner—Shuwang Liu
Assistant Examiner—Crystal L Hammond
(74) Attorney, Agent, or Firm—Cantor Colburn LLP; Michael J. LeStrange

(57) ABSTRACT

A process compensation circuit for an inverting element of a CMOS device, including a duplicate inverting element connected in parallel with the inverting element of the CMOS device. An upside-down inverter stage has an input connected to the output of the duplicate inverting element, and an output connected to the output of the inverting element of the CMOS device. The upside-down inverter stage is configured to counteract a delayed logic transition of the output of the inverting element of the CMOS device in the event of a process skew between NFET and PFET devices.

9 Claims, 2 Drawing Sheets

APPARATUS FOR HYSTERESIS BASED PROCESS COMPENSATION FOR CMOS RECEIVER CIRCUITS

BACKGROUND

The present invention relates generally to digital receiver circuits and, more particularly, to an apparatus for hysteresis based process compensation for CMOS receiver circuits.

It is well known in the art to use CMOS (Complementary Metal Oxide Semiconductor) receivers to interface with input signals from off-chip, signals that typically operate at a different voltage with respect to the internal, on-chip devices. One common type of CMOS receiver is what is referred to as a NAND-INVERTER 100, shown in FIG. 1. This receiver 100 includes a first NAND gate stage 102 and a second inverter stage 104, and has a pair of inputs thereto. A first input (PAD) represents the actual data that is input to the receiver, while a second input (ENABLE) is used to selectively pass the input signal received at the data input (PAD). Otherwise, the output (OUT) of the receiver 100 is driven to logic 0 regardless of the value of the input signal.

As particularly shown in the insert portions of FIG. 1 (which depict the transistor arrangement of the NAND and inverter stages), the data input PAD is connected to the gates of PFET P1 and NFET N1. Similarly, the ENABLE input is connected to the gates of PFET P2 and NFET N2. The PFETs P1 and P2 are connected in parallel, while the NFETs N1 and N2 are connected in series, thereby forming a NAND gate 102 of conventional design. The output of the NAND gate 102 defines an intermediate node 106, which is connected to the gates of PFET P3 and NFET N3 (arranged as a conventional inverter 104), the output of which is the output of the receiver 100. For such an off-chip receiver, the input NAND stage 102 operates at the off-chip voltage ($V_{DD2}$) while the output inverter stage 104 operates at the internal chip voltage ($V_{DD}$).

Depending on process variations, among other things, the input voltage at which the output of a CMOS inverter switches can vary by as much as 700 or 800 mV. Due to this variation, the switch point of the CMOS inverter tends to be unstable and susceptible to noise. Consequently, the use of hysteresis effects enables suppression of output noise by adjusting the threshold voltages of the pull up and pull down devices in a CMOS receiver, depending on the present state of the output. For example, FIG. 1 further illustrates the use of hysteresis through a pair of inverter stages 108, 110, configured as a latch that reinforces the value of the intermediate node 106.

This arrangement is intended to create a higher input voltage threshold value ($V_{TH}$) when the output transitions from low to high, and a lower input voltage threshold value ($V_{TL}$) when the output transitions from high to low. Thereby, an input noise margin of $V_{TH}$-$V_{TL}$ is provided.

However, as secondary input/output supply voltages have become lower and lower over time, the effects of PFET to NFET mistracking have become a larger percent of the total hysteresis range. This has, in turn, caused the hysteresis effects to approach or move outside of specifications under certain process conditions that have NFET to PFET skew. Accordingly, it would be desirable to be able to compensate for such devices that fall within design specifications but that do not produce acceptable yield results due to process skew.

SUMMARY

The foregoing discussed drawbacks and deficiencies of the prior art are overcome or alleviated by a process compensation circuit for an inverting element of a CMOS device, including a duplicate inverting element connected in parallel with the inverting element of the CMOS device. An upside-down inverter stage has an input connected to the output of the duplicate inverting element, and an output connected to the output of the inverting element of the CMOS device. The upside-down inverter stage is configured to counteract a delayed logic transition of the output of the inverting element of the CMOS device in the event of a process skew between NFET and PFET devices.

In another embodiment, a process compensation device for a CMOS receiver having a NAND stage and an inverter stage includes a duplicate NAND gate stage connected in parallel with the NAND gate stage of the CMOS receiver. An upside-down inverter stage has an input connected to the output of the duplicate NAND gate stage, and an output connected to the output of the NAND stage of the CMOS receiver. The upside-down inverter stage is configured to counteract a delayed logic transition of the output of the NAND gate stage of the CMOS device in the event of a process skew between NFET and PFET devices.

In still another embodiment, a CMOS receiver device includes an input NAND stage operating at a first voltage level, the input NAND stage having a data input and an enable input connected thereto. An output inverter stage operates at a second voltage level, the output inverter stage having an input connected to an output of the input NAND stage, which defines an intermediate node. A hysteresis latch is coupled to the intermediate node, the hysteresis latch including a pair of inverter stages. A process compensation circuit is coupled in parallel with the input NAND stage, the process compensation circuit further including a duplicate NAND stage receiving the data input and the enable input. An upside-down inverter stage has an input coupled to an output of the duplicate NAND stage and an output connected to the intermediate node. The upside-down inverter stage is configured to counteract a delayed logic transition of the output of said input NAND stage in the event of a process skew between NFET and PFET devices.

BRIEF DESCRIPTION OF THE DRAWINGS

Referring to the exemplary drawings wherein like elements are numbered alike in the several Figures.

DETAILED DESCRIPTION

Figure 2:
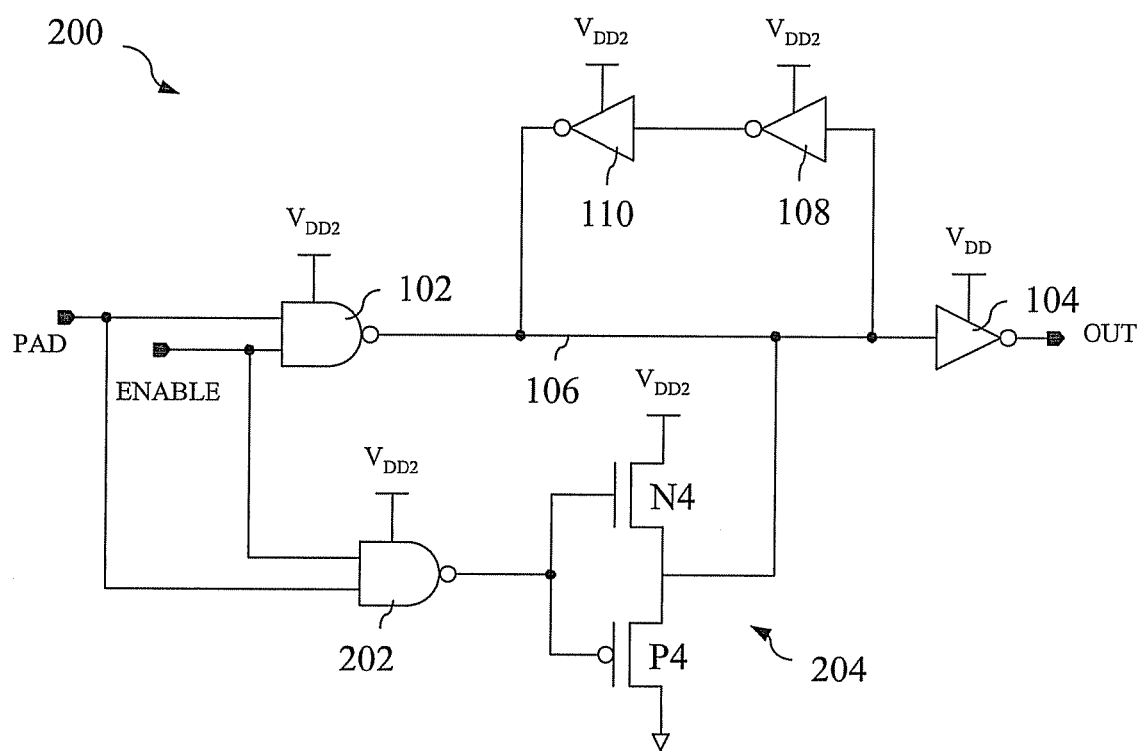
FIG. 2 is a schematic diagram of a CMOS receiver circuit with hysteresis based process compensation, in accordance with an embodiment of the invention.

Referring now to FIG. 2, there is shown a schematic diagram of a CMOS receiver circuit 200 with hysteresis based process compensation, in accordance with an embodiment of the invention. As is shown, process compensation is implemented through the addition of a duplicate NAND stage 202 that is in turn coupled to an upside-down inverter stage 204, the output of which is coupled to the intermediate node 106 of the receiver. As used herein, the term "upside-down inverter" describes a CMOS device in which the NFET device N4 is coupled to the logic high supply rail (e.g., $V_{DD2}$) while the PFET device P4 is coupled to the logic low supply rail (e.g., ground), which is the opposite polarity configuration with respect to a conventional CMOS inverter.

Figure 1:
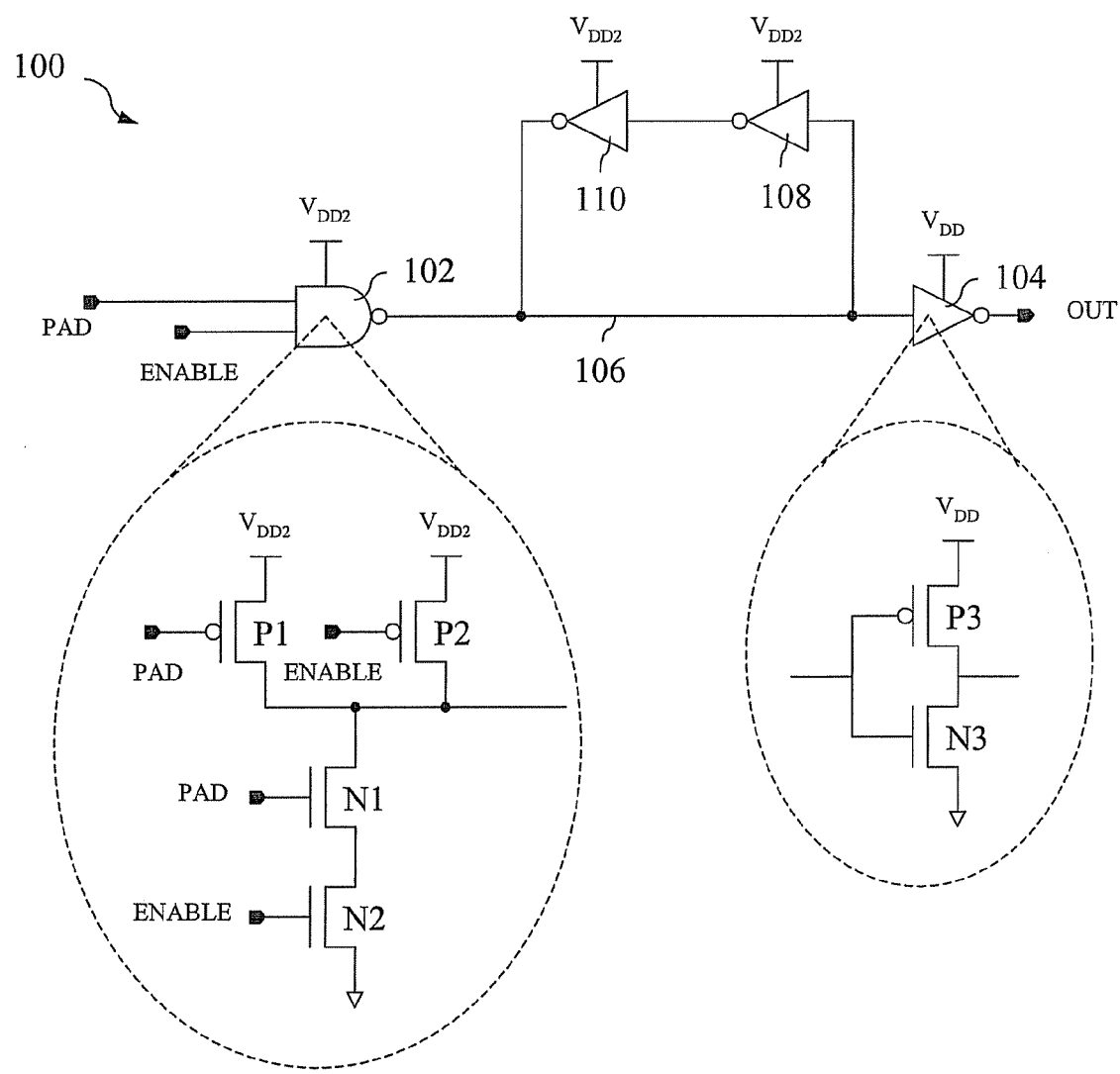
FIG. 1 is a schematic diagram of an existing CMOS receiver circuit 100 with hysteresis compensation.

In the event of a process skew, the upside-down inverter stage 204 will act to compensate for a relative weakness in either the PFET devices or the NFET devices. By way of example, it is first assumed that the receiver 100 of FIG. 1 suffers from a process skew such that the NFET devices are disproportionately weak with respect to the PFET devices. In this case, the transition of the intermediate node 106 from logic 1 to logic 0 (corresponding to a transfer of the input signal on PAD from a 0 to a 1, and assuming ENABLE is at 1) is longer due to the weakness of N1 and N2. However, through the compensation device provided in FIG. 2, this relative weakness is exploited in order to pull down the intermediate node faster than would be the case for the receiver of FIG. 1.

More specifically, the duplicate NAND stage 202 generates the same slow, high to low transition output signal as NAND stage 202. In the case of a weak NFET process, the relatively stronger PFET P4 (coupled in this case to ground) assists the intermediate node 106 to transition to low. Even though PFET devices do not strongly couple to ground potential and even though NFET devices do not strongly couple to $V_{DD}$ potential, the fact that P4 is disproportionately strong with respect to N4 provides enough of a difference to assist bringing intermediate node 106 to ground.

Conversely, for a process condition where the PFET devices are disproportionately weak with respect to the NFET devices, the transition of the intermediate node 106 from logic 0 to logic 1 (corresponding to a transfer of the input signal on PAD from a 1 to a 0, and assuming ENABLE is at 1) is longer due to the weakness of P1. In this case, therefore, the duplicate NAND stage 202 generates the same slow, low to high transition output signal as NAND stage 202. In the case of a weak PFET process, the relatively stronger NFET N4 (coupled in this case to $V_{DD2}$) now assists the intermediate node 106 to transition to high. Finally, where no appreciable process skew exists, the upside-down inverter stage 204 has essentially no effect on the transitioning of the intermediate node 106.

The NFET and PFET devices of the compensation device are relatively small compared to the input NAND gate devices (e.g., on the order of about 1/10th the width), thereby making the relative area impact as a result of the added devices negligible. Accordingly, by providing the above described process compensation circuit, accurate hysteresis over wide process ranges is attainable, and without significant overhead.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A process compensation circuit for an inverting element of a CMOS device, comprising:
   a duplicate inverting element connected in parallel with the inverting element of the CMOS device; and
   an upside-down inverter stage having an input thereto connected to an output of said duplicate inverting element, and said upside-down inverter stage having an output thereof connected to an output of said inverting element of the CMOS device;
   wherein said upside-down inverter stage is configured to counteract a delayed logic transition of the output of the inverting element of the CMOS device in the event of a process skew between NFET and PFET devices.

2. The process compensation circuit of claim 1, wherein said upside-down inverter stage further comprises:
   an NFET having a gate coupled to the output of said duplicate inverting element, said NFET having a source coupled to a logic high voltage supply terminal of the CMOS device;
   a PFET having a gate coupled to the output of said duplicate inverting element, said PFET having a source coupled to a logic low voltage supply terminal of the CMOS device; and
   a drain of said NFET coupled to a drain of said PFET, which defines said output of said upside-down inverter stage.

3. The process compensation circuit of claim 2, wherein said NFET and said PFET of said upside-down inverter stage are formed at a size about 10 times smaller with respect to NFET and PFET devices of the inverting element of the CMOS device.

4. A process compensation device for a CMOS receiver having a NAND gate stage and an inverter stage; comprising:
   a duplicate NAND gate stage connected in parallel with the NAND gate stage of the CMOS receiver; and
   an upside-down inverter stage having an input connected to an output of said duplicate NAND gate stage, and said upside-down inverter stage having an output connected to the output of said NAND gate stage of the CMOS receiver;
   wherein said upside-down inverter stage is configured to counteract a delayed logic transition of the output of the NAND gate stage of the CMOS receiver in the event of a process skew between NFET and PFET devices.

5. The process compensation device of claim 4, wherein said upside-down inverter stage further comprises:
   an NFET having a gate coupled to the output of said duplicate NAND gate stage, said NFET having a source coupled to a first logic high voltage supply terminal of the CMOS receiver;
   a PFET having a gate coupled to the output of said duplicate NAND gate stage, said PFET having a source coupled to a logic low voltage supply terminal of the CMOS receiver; and
   a drain of said NFET coupled to a drain of said PFET, which defines said output of said upside-down inverter stage.

6. The compensation circuit of claim 5, wherein said NFET and said PFET of said upside-down inverter stage are formed at a size about 10 times smaller with respect to NFET and PFET devices of the NAND gate stage of the CMOS receiver.

7. A CMOS receiver device, comprising:
an input NAND stage operating at a first voltage level, said input NAND stage having a data input and an enable input connected thereto;
an output inverter stage operating at a second voltage level, said output inverter stage having an input connected to an output of said input NAND stage, which defines an intermediate node;
a hysteresis latch coupled to said intermediate node, said hysteresis latch comprising a pair of inverter stages; and
a process compensation circuit coupled in parallel with said input NAND stage, said process compensation circuit further comprising a duplicate NAND stage receiving said data input and said enable input, and an upside-down inverter stage having an input coupled to an output of said duplicate NAND stage and said upside-down inverter stage having an output connected to said intermediate node;
wherein said upside-down inverter stage is configured to counteract a delayed logic transition of said output of said input NAND stage in the event of a process skew between NFET and PFET devices.

8. The CMOS receiver device of claim 7, wherein said upside-down inverter stage further comprises:
an NFET having a gate coupled to the output of said duplicate NAND stage, said NFET having a source coupled to a logic high voltage supply terminal of the CMOS receiver corresponding to said first voltage level;
a PFET having a gate coupled to the output of said duplicate NAND stage, said PFET having a source coupled to a logic low voltage supply terminal of the CMOS receiver; and
a drain of said NFET coupled to a drain of said PFET, which defines said output of said upside-down inverter stage.

9. The CMOS receiver device of claim 8, wherein said NFET and said PFET of said upside-down inverter stage are formed at a size about 10 times smaller with respect to NFET and PFET devices of said input NAND stage.

* * * * *